United States Patent
Xu et al.

(10) Patent No.: US 8,401,129 B2
(45) Date of Patent: Mar. 19, 2013

(54) DIGITAL AUTOMATIC GAIN CONTROL

(75) Inventors: Honghui Xu, Buffalo Grove, IL (US); Shidong Chen, Hoffman Estates, IL (US)

(73) Assignee: Techwell LLC, Milpitas, CA (US)

(*) Notice: Subject to any disclaimer, the term of this patent is extended or adjusted under 35 U.S.C. 154(b) by 450 days.

(21) Appl. No.: 12/622,151

(22) Filed: Nov. 19, 2009

(65) Prior Publication Data

US 2011/0116582 A1     May 19, 2011

(51) Int. Cl.
    *H04L 27/08* (2006.01)
(52) U.S. Cl. ...... 375/345; 330/129; 330/254; 455/234.1
(58) Field of Classification Search ................ 375/345; 330/129, 254; 455/234.1
    See application file for complete search history.

(56) References Cited

U.S. PATENT DOCUMENTS

| | | | |
|---|---|---|---|
| 4,263,560 A | 4/1981 | Ricker | |
| 5,623,521 A | 4/1997 | Yaguchi et al. | |
| 5,784,410 A | 7/1998 | Nakano | |
| 5,982,235 A | 11/1999 | Kinomura | |
| 6,370,210 B1 | 4/2002 | Yamamoto | |
| 6,708,025 B2 | 3/2004 | Iwata et al. | |
| 6,782,061 B2 | 8/2004 | Ichihara | |
| 6,843,597 B1 | 1/2005 | Li et al. | |
| 7,076,223 B2* | 7/2006 | Matsugatani et al. | 455/232.1 |
| 7,116,733 B2 | 10/2006 | Yamanaka et al. | |
| 7,277,510 B1* | 10/2007 | Kilani et al. | 375/345 |
| 7,386,285 B2 | 6/2008 | Yamauchi | |
| 7,408,493 B2 | 8/2008 | Lusky et al. | |
| 7,436,913 B2* | 10/2008 | Kang et al. | 375/345 |
| 7,501,895 B2 | 3/2009 | Yang | |
| 7,504,884 B2 | 3/2009 | Ra et al. | |
| 7,596,192 B2* | 9/2009 | Furuya | 375/345 |
| 7,924,524 B2* | 4/2011 | Dahle et al. | 360/65 |
| 2003/0026363 A1 | 2/2003 | Stoter et al. | |
| 2005/0146643 A1 | 7/2005 | Lee | |
| 2006/0222118 A1 | 10/2006 | Murthy et al. | |
| 2007/0268408 A1 | 11/2007 | Kim et al. | |
| 2008/0273636 A1 | 11/2008 | Zhu et al. | |
| 2009/0042526 A1 | 2/2009 | Maulik et al. | |
| 2009/0092207 A1* | 4/2009 | Takahashi | 375/345 |

FOREIGN PATENT DOCUMENTS

| | | |
|---|---|---|
| JP | 61009009 | 1/1986 |
| JP | 11195942 | 7/1999 |

(Continued)

OTHER PUBLICATIONS

ATSC, "A/53: ATSC Digital Television Standard, Parts 1-6, 2007", Advanced Television Systems Committee, Inc., Washington, D.C., available online at: <http://www.atsc.org/standards/a53/a_53-Part-1-6-2007.pdf>, 136 pages, Jan. 3, 2007.

(Continued)

*Primary Examiner* — Juan A Torres
(74) *Attorney, Agent, or Firm* — Fogg & Powers LLC (57) ABSTRACT

An automatic gain control ("AGC") system. The system includes a first multiplier, an envelope detector, a summation module, a filter module, a convergence module, and a feedback module. The convergence module includes a convergence control module and a second multiplier. The feedback module includes an accumulator, a scalar multiplier module, and a third multiplier. The system is configured to adjust or modify its convergence speed according to the state of convergence of the AGC system, and the convergence speed of the AGC system is substantially independent of a signal level of the received signal.

21 Claims, 7 Drawing Sheets

FOREIGN PATENT DOCUMENTS

| KR | 20000061607 | 10/2000 |
|---|---|---|
| KR | 1020040024805 | 3/2004 |

OTHER PUBLICATIONS

ATSC, ATSC Recommended Practice: Receiver Performance Guidelines (with Corrigendum No. 1 and Amendment No. 1), Doc. A/74, Advanced Television Systems Committee, Washington, D.C., available online at: <http://www.atsc.org/standards/a_74-w-Corr-1-Amend-1.pdf>, 69 pages, Jun. 18, 2004, Corrigendum No. 1 dated Jul. 11, 2007, Amendment No. 1 dated Nov. 29, 2007.

Korean Intellectual Property Office, "Notice of Allowance", "from Foreign Counterpart of U.S. Appl. No. 12/622,151", Nov. 14, 2012, pp. 1-3, Published in: KR.

* cited by examiner

DIGITAL AUTOMATIC GAIN CONTROL

BACKGROUND

This invention relates to digital automatic gain control ("AGC") circuits. AGC is used to reduce the dynamic range of received signals in a communication system. Many common AGC circuits use a feedback loop to drive the received signals to a desired reference level.

Figure 1:
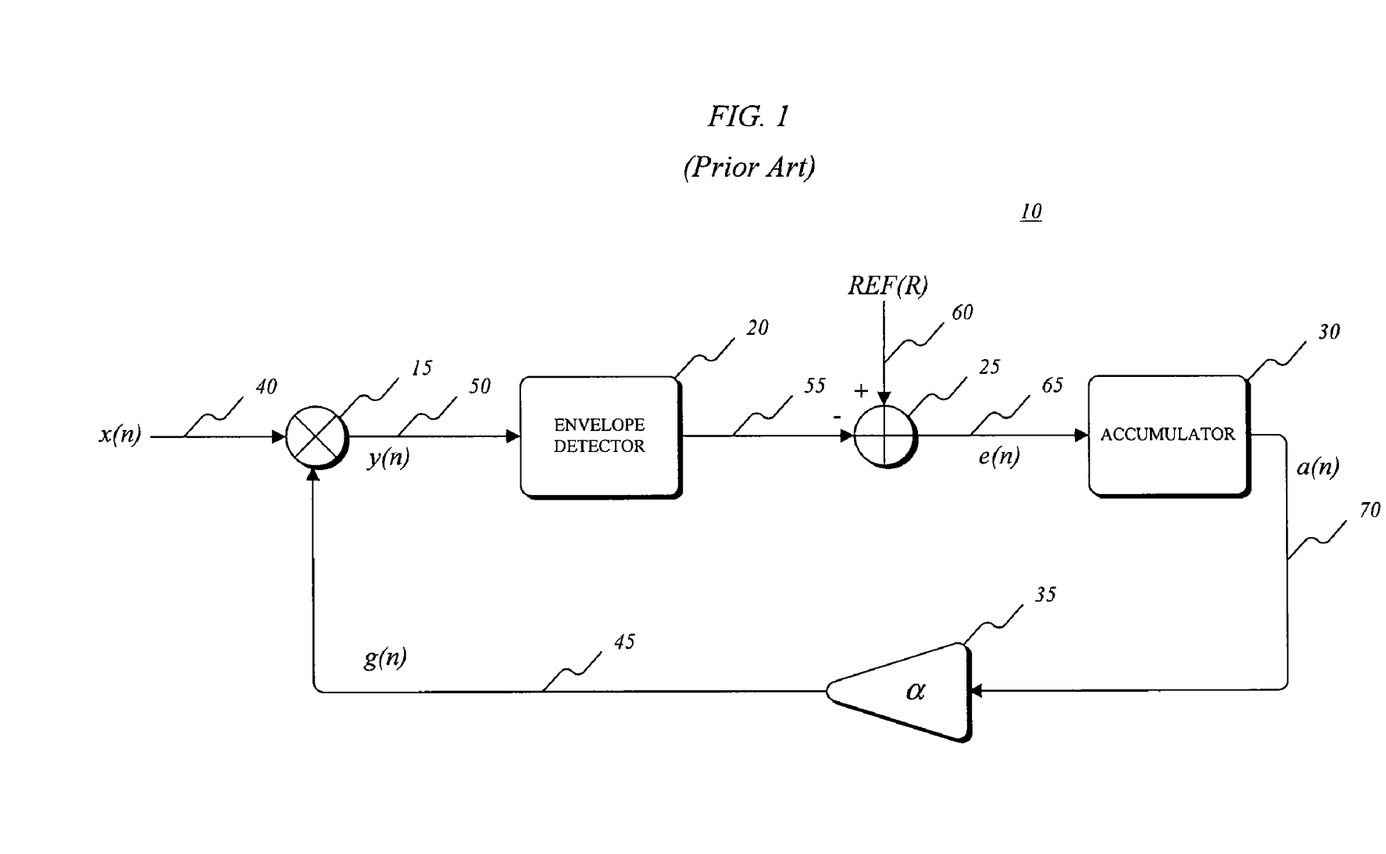
FIG. 1 is a diagram of a linear automatic gain control ("AGC") circuit.
Figure 3:
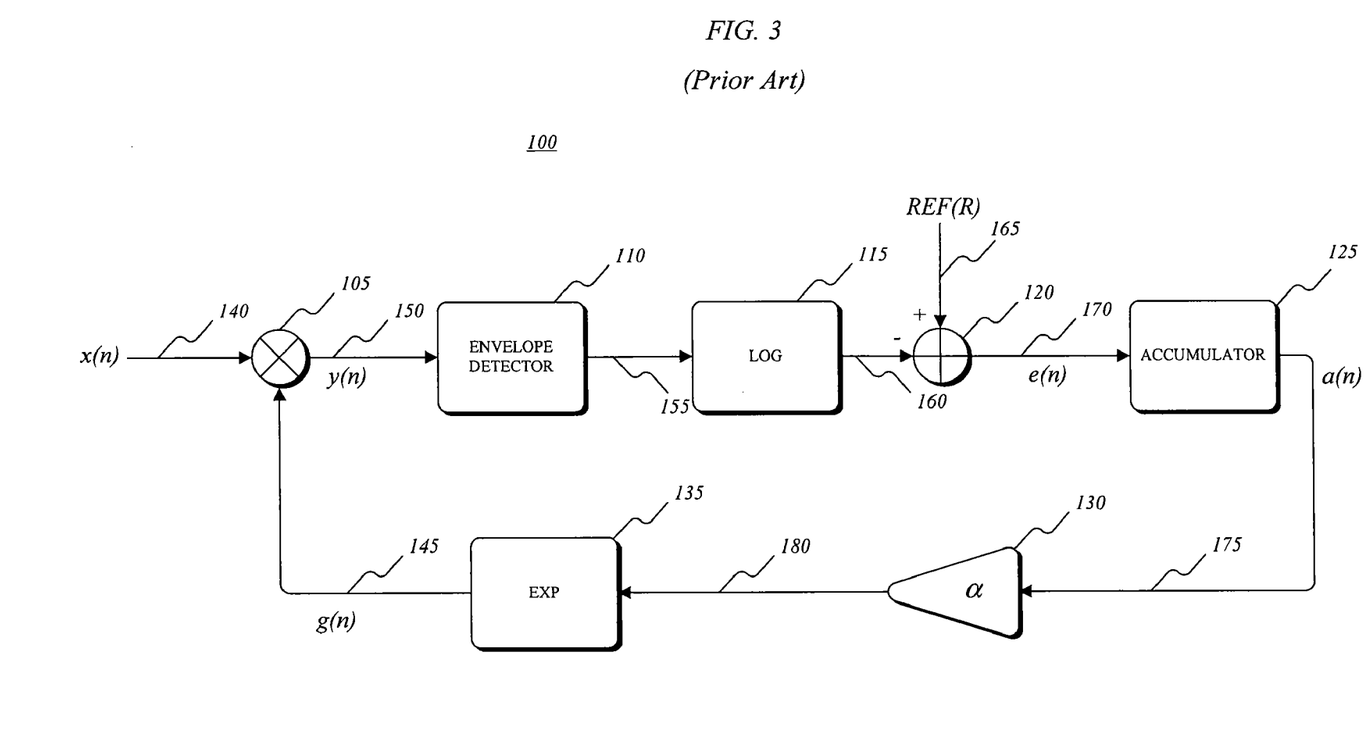
FIG. 3 is a diagram of a log-exponential AGC circuit.

FIGS. 1 and 3 illustrate two such AGC circuits. The AGC circuit 10 of FIG. 1 includes a multiplier 15, an envelope detector 20, a summation module 25 (e.g., an adder), an accumulator 30, and a scalar multiplier module 35. A received signal, x(n) 40, which is a real or complex signal, is multiplied by an AGC circuit gain, g(n) 45, at the multiplier 15 to produce a gain adjusted signal, y(n) 50. The envelope detector 20 obtains and outputs an envelope signal 55 of the gain adjusted signal, y(n) 50. The detected envelope signal 55 is subtracted from a reference signal, R 60, at the summation module 25 and an error signal, e(n) 65, is generated.

Figure 2:
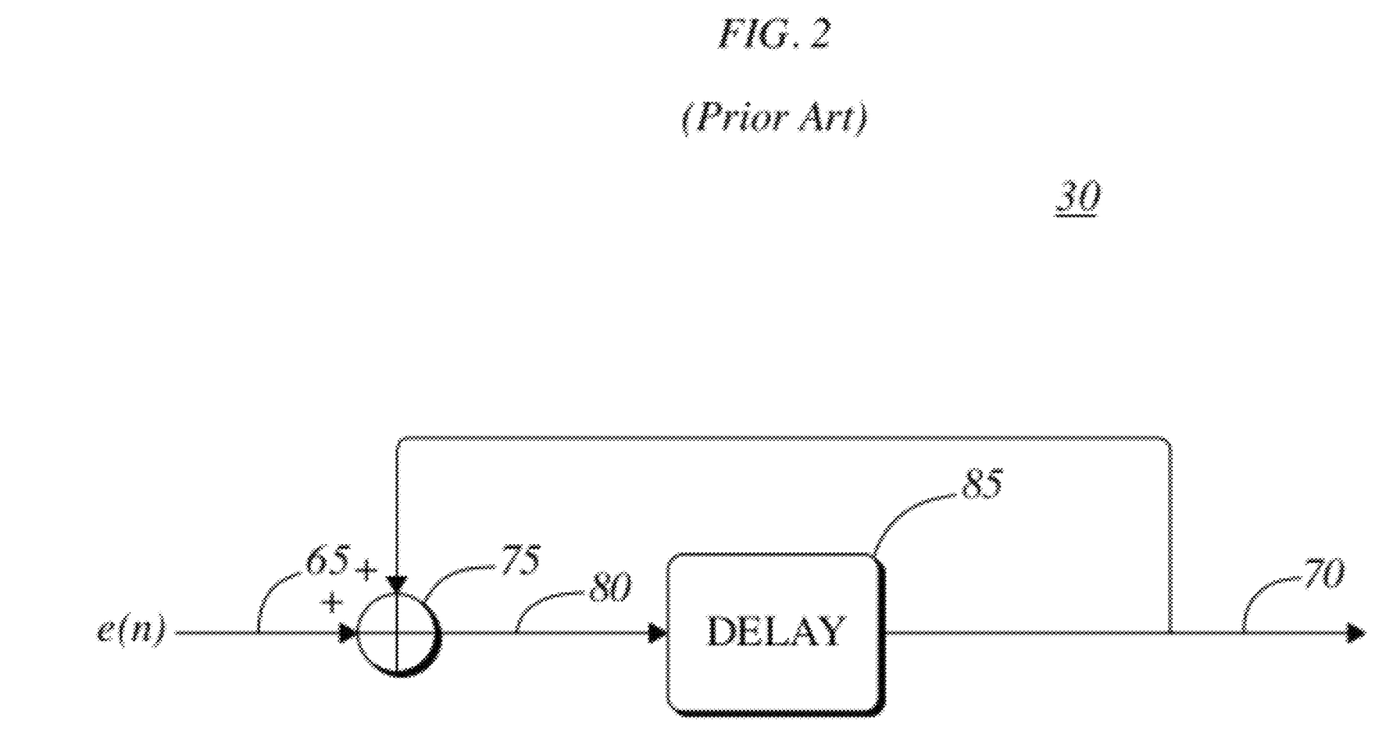
FIG. 2 is a diagram of an accumulator.

The accumulator 30 is illustrated in greater detail in FIG. 2. An input signal, such as the error signal, e(n) 65, is added to a delayed output, a(n) 70, by an adder 75. An output 80 of the adder 75 is delayed by a delay module 85 by, for example, one symbol, and the delayed signal is the output, a(n) 70, of the accumulator 30. With reference once again to FIG. 1, the output, a(n) 70, from the accumulator 30 is adjusted in the scalar multiplier module 35 by a scalar value, α, to control the convergence speed of the AGC circuit 10. For example, for a scaled step function input x(n)=cu(n), the output, g(n) 45, of the scalar multiplier module 35 is given by EQN. 1 below, which results in an AGC loop time constant that is approximately equal to $1/\alpha c$ $$g(n) = \frac{R}{c}[1 - (1 - \alpha c)^n]u(n) \qquad \text{EQN. 1}$$

As such, the linear AGC circuit 10 of FIG. 1 has a different AGC convergence speed for different signal levels, c, of the received signal, x(n) 40. If the received signal, x(n) 40, is weak, the time constant is large, and the AGC convergence speed is slow. If the received signal, x(n) 40, is strong, the time constant is small, and the AGC convergence speed is fast. Following stabilization, the AGC circuit 10 drives the signal level of the gain adjusted signal, y(n) 50, to the signal level of the reference signal, R 60.

Although the signal level of the received signal, x(n) 40, appears to be constant or approximately constant when viewed over a long period of time, the short term or instantaneous signal level of the received signal, x(n) 40, is continuously changing. The instantaneous signal level depends on, among other things, the transmitted symbols, channel response, and noise. The statistics (e.g., variance) of the AGC circuit 10 are different for different signal levels of the received signal, x(n) 40. Changes in the instantaneous signal level introduce noise into the AGC circuit gain, g(n) 45, and therefore, also introduce noise into the AGC output signal, y(n) 50. For the AGC circuit 10 of FIG. 1, more noise is introduced for strong received signals than for weak received signals.

The relationship between the signal level of the received signal, x(n) 40, and the noise introduced into the AGC circuit 10 of FIG. 1 is given below. Following stabilization of the AGC circuit, the relations of EQNS. 2 and 3 hold.

$$a(n)\alpha x(n) = R \Rightarrow a(n) = \frac{R}{\alpha x(n)} \qquad \text{EQN. 2}$$

and $$a(n) = a(n-1)(1 - \alpha x(n)) + R \qquad \text{EQN. 3}$$

where a(n) is the output 70 of the accumulator 30.

If the received signal, x(n) 40, is changed to $x(n+1)=x(n)(1+\Delta)$, the relative change in gain, $\Delta g_r(n)$, is given by EQN. 4.

$$\Delta g_r(n) = \frac{a(n+1) - a(n)}{a(n)} \approx \frac{-\Delta R}{a(n)} \qquad \text{EQN. 4}$$

Because the relative gain change depends inversely on the output, a(n) 70, of the accumulator 30, and because a(n) is small for strong signals, the variance in the AGC circuit gain, g(n) 45, is large for strong signals.

FIG. 3 illustrates another common AGC circuit 100. The circuit 100 includes a multiplier 105, an envelope detector 110, a logarithm module 115, a summation module 120, an accumulator 125, a scalar multiplier module 130, and an exponential module 135. A received signal, x(n) 140, is multiplied by an AGC gain, g(n) 145, at the multiplier 105. An output, y(n) 150, of the multiplier 105 is input to the envelope detector 110. An output 155 of the envelope detector 110 is converted to a log scale by the logarithm module 115. An output 160 of the logarithm module 115 is subtracted from a reference signal, R 165, at the summation module 120 to obtain an error signal, e(n) 170. The accumulator 125 functions in a manner similar to the accumulator 30 described above, and an output, a(n) 175, of the accumulator 125 is adjusted by a scalar value, α, in the scalar multiplier module 130 to control the convergence speed of the AGC circuit 100. An output 180 of the scalar multiplier module 130 is converted to a linear scale by an exponential module 135 to obtain the AGC circuit gain, g(n) 145.

The AGC circuit 100 is able to achieve approximately the same convergence speed and statistics for received signals having different signal levels. However, a primary disadvantage of the AGC circuit 100 is the complexity involved in implementing the circuit 100.

SUMMARY

Embodiments of the invention provide an automatic gain control ("AGC") system or circuit that includes a multiplier, an envelope detector, a summation module, a filter module, a convergence module, and a feedback module. The circuit is configured to adjust its convergence speed according to the state of the system convergence. An error signal is generated as the difference between a reference signal and a scaled input signal. The generated error signal is processed by the convergence module to determine the convergence state of the AGC circuit, and the convergence speed of the circuit is adjusted according to the processed error signal. An output of the convergence module is input to the feedback module, and the feedback module generates an AGC circuit gain. The response time (e.g., the time required for the system to converge) of the AGC circuit is insensitive to the signal level of the received signal.

In one embodiment, the invention provides an AGC system having an AGC gain and an AGC convergence speed. The AGC system includes a summation module, a convergence module, and a feedback module. The summation module is configured to determine an error signal based at least in part on a received signal and a reference signal. The convergence module is configured to generate a convergence speed gain for the AGC system based at least in part on the error signal, and output a scaled error signal. The scaled error signal is based at least in part on the convergence speed gain and the error signal. The feedback module is configured to receive an input signal and output the AGC gain. The input signal is based at least in part on the AGC gain and the scaled error signal, and the AGC convergence speed is substantially independent of a signal level of the received signal.

In another embodiment, the invention provides a method of AGC in a digital receiver. The digital receiver includes an AGC module having an AGC gain and an AGC convergence speed. The method includes determining an error signal based at least in part on a received signal and a reference signal; generating, in a convergence module, a convergence speed gain based at least in part on the error signal; and generating a scaled error signal based at least in part on the convergence speed gain and the error signal. The method also includes generating a feedback signal based at least in part on the AGC gain and the scaled error signal. The AGC gain is based at least in part on the feedback signal, and the AGC convergence speed is substantially independent of a signal level of the received signal.

In yet another embodiment, the invention provides a device configured to process digital signals. The device includes a receiver having a demodulator, an equalizer, and an AGC module. The AGC module is configured to determine an error signal based at least in part on a received signal and a reference signal, generate a convergence speed gain based at least in part on the error signal, generate a scaled error signal based at least in part on the convergence speed gain and the error signal, and generate a feedback signal based at least in part on the AGC gain and the scaled error signal. The AGC gain is based at least in part on the feedback signal, and the AGC convergence speed is substantially independent of a signal level of the received signal.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Embodiments of the invention described herein relate to an automatic gain control ("AGC") system or circuit. The system includes a first multiplier, an envelope detector, a summation module, a filter module, a convergence module, and a feedback module. The convergence module includes a convergence control module and a second multiplier. The feedback module includes an accumulator, a scalar multiplier module, and a third multiplier. The circuit is configured to adjust or modify its convergence speed according to the state of convergence of the AGC circuit. An error signal is generated as the difference between a reference signal and a scaled input signal (e.g., an output of the envelope detector). The error signal is filtered by the filter module and processed by the convergence module to determine the convergence state of the AGC circuit. The convergence speed of the AGC circuit is adjusted according to the processed error signal. An output of the convergence module is input to the feedback module, and the feedback module generates an AGC circuit gain. The AGC circuit gain is multiplied by the received signal at the first multiplier. Following convergence and stabilization of the AGC circuit, an output of the AGC circuit is equal or approximately equal to the reference signal.

The elements, components, and modules within the AGC system are implemented using hardware, software, or a combination of hardware and software. In some embodiments, for example, the AGC system is implemented using a controller, a microcontroller, a microprocessor, or another suitable processing device. The processing device includes, among other things, a processing unit, a memory, and a bus. The bus connects various components of the processing device including the memory and the processing unit. The memory includes, for example, read only memory ("ROM"), random access memory ("RAM"), electrically-erasable programmable read-only memory ("EEPROM"), or flash memory. The processing device also includes an input/output system having routines for transferring information between components within the processing device. Software or executable instructions included in the implementation of the AGC system are stored in the memory of the processing device or a memory connected to the processing device. In other embodiments, the processing device includes additional, fewer, or different components.

In some embodiments, the AGC system is implemented partially or entirely on a semiconductor chip (e.g., an FPGA semiconductor chip), such as a chip developed through a register transfer level ("RTL") design process. In embodiments of the invention where the AGC system is not implemented entirely in a semiconductor chip, the AGC system is implemented at least partially on, for example, a printed circuit board ("PCB"). The PCB is populated with a plurality of electrical and electronic components which are used at least partially in combination to implement the AGC system. In some embodiments, the PCB includes the processing device or chip. The PCB also includes, for example, a plurality of additional passive and active components such as resistors, capacitors, inductors, integrated circuits, and amplifiers. These components are arranged and connected to provide electrical functions to the PCB which are required to implement the AGC system. The functions include, among other things, filtering, signal conditioning, signal level detection, addition, multiplication, integration, derivation, and voltage or current regulation. For descriptive purposes, the chip or the PCB and the electrical components populated on the PCB are collectively referred to as "the receiver." The receiver is included in, or implemented in combination with, a variety of electrical and electronic devices, such as the digital communications device 200 illustrated in FIG. 4.

Figure 4:
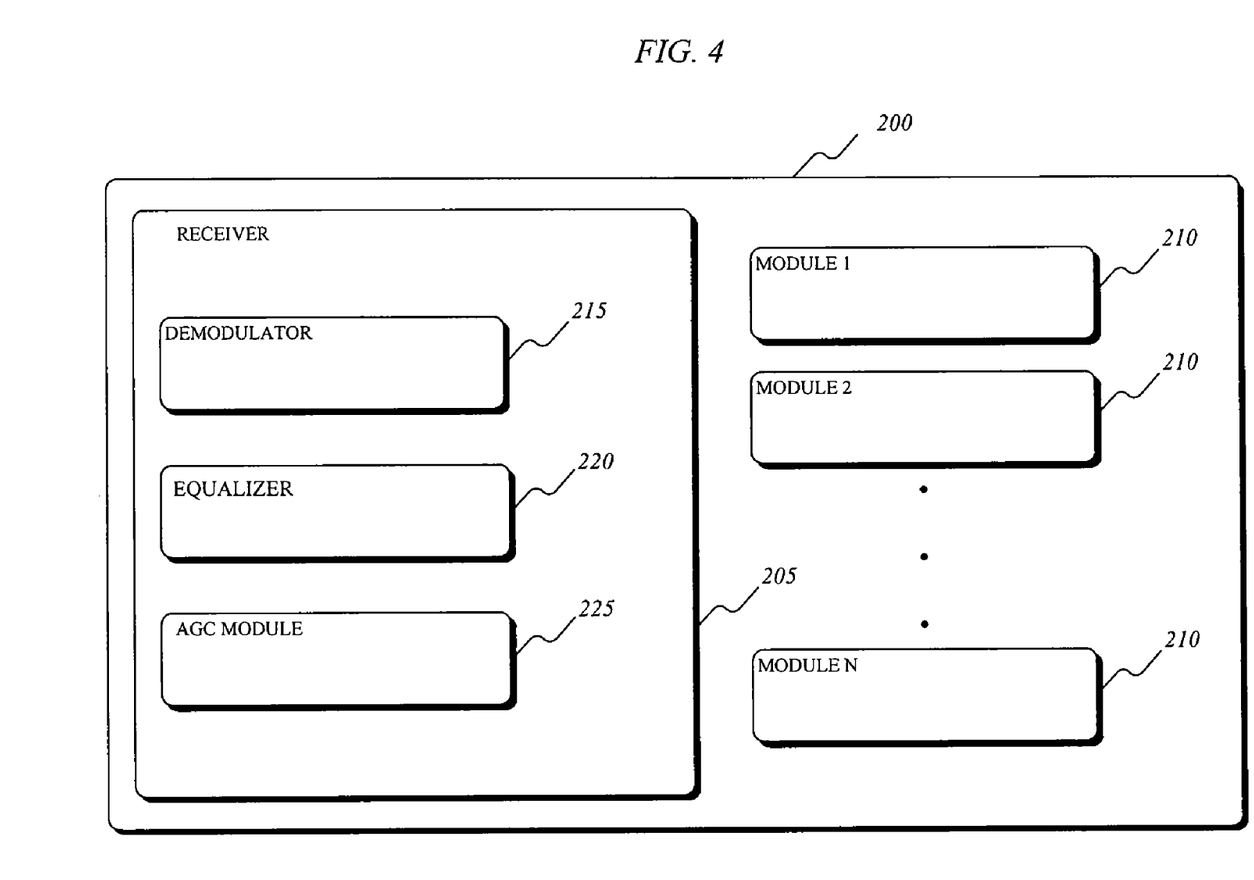
FIG. 4 illustrates a device according to an embodiment of the invention.

In the illustrated embodiment, the device 200 includes a receiver module 205 and optional hardware and/or software module(s) 210 that provide additional functions (e.g., display functions) to the device 200. In other embodiments, the device 200 includes more or fewer modules. For example, certain depicted modules are implemented on other devices that interface with the device 200 (e.g., the receiver module 205 interfaces with a display module incorporated into a separate device). The receiver module 205 includes, among other things, a demodulator 215, an equalizer 220, and an AGC module 225. In other embodiments, the receiver module 205 includes one or more additional modules, such as, for example, a tuner, a sync and timing recovery module, a matched filter, a phase tracker, a deinterleaver, a carrier recovery module, a decoder, a slicer, and/or a derandomizer. The AGC module 225 includes the hardware, software, or combination of hardware and software described above which is necessary to implement an AGC system or circuit, such as the AGC circuit 300 illustrated in FIG. 5.

Figure 5:
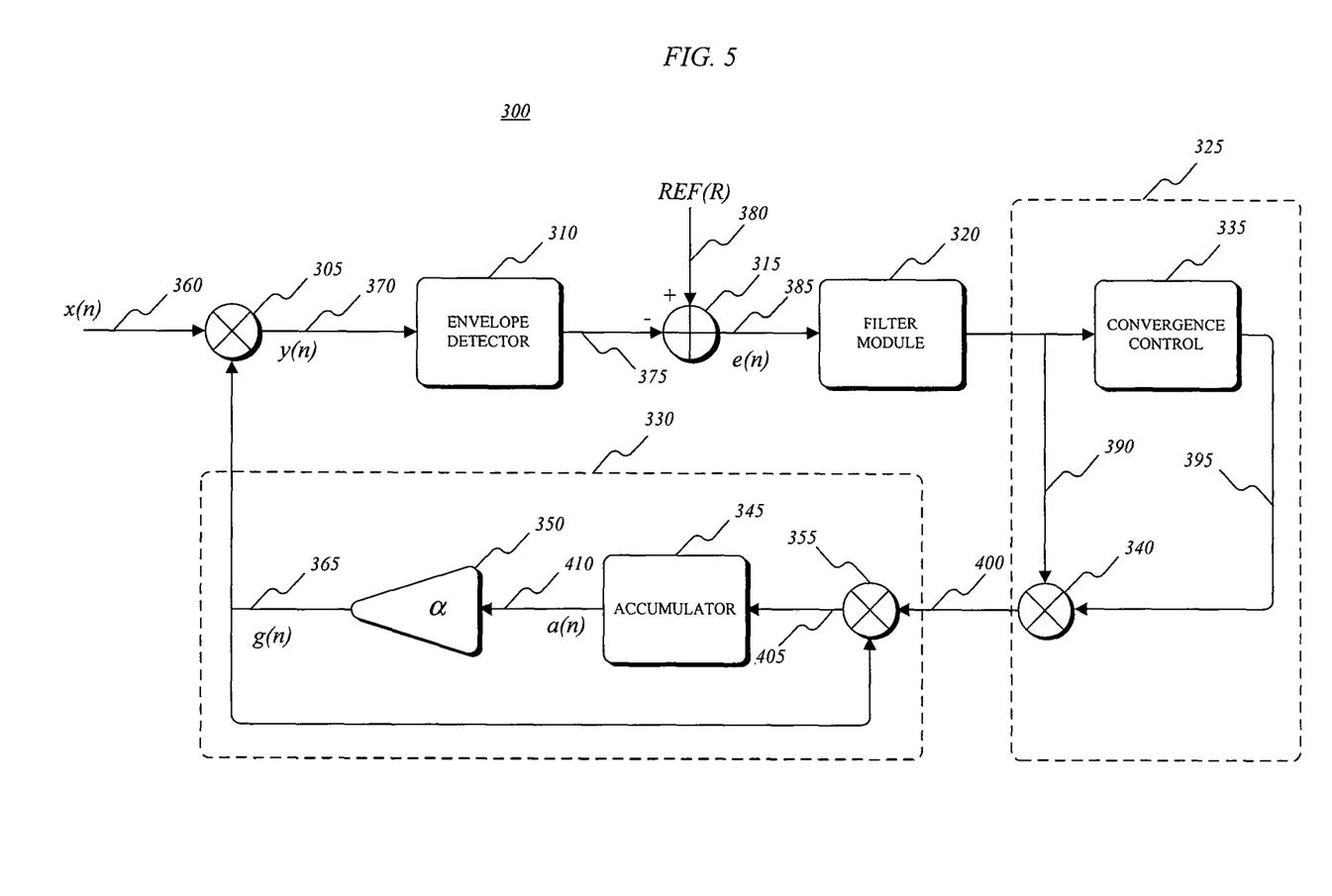
FIG. 5 is a diagram of an AGC circuit according to an embodiment of the invention.

The circuit 300 includes a first multiplier 305, an envelope detector 310, a summation module 315, a filter module 320, a convergence module 325, and a feedback module 330. The convergence module 325 includes a convergence control module 335 and a second multiplier 340. The feedback module 330 includes an accumulator 345, a scalar multiplier module 350, and a third multiplier 355. In some embodiments, the filter module 320, the convergence control module 335, and the multipliers 305, 340, and 355, are implemented using, for example, bit shifting, addition, or look-up tables ("LUTs"). The components and modules depicted in FIG. 5, as well as the signals which are input to and output from the various components and modules, are explicitly described with respect to the configuration of circuit 300 in FIG. 5. However, the configuration of the circuit 300 illustrated in FIG. 5 is shown for descriptive purposes, and is not intended to represent the only possible configuration of the circuit 300. In other embodiments, different groupings of components and modules within the circuit 300 are possible. For example, the convergence module 325 and the feedback module 330 can be described as a single module, a single feedback loop, or as the individual components and modules which comprise the convergence module 325 and feedback module 330. Specific references to inputs and outputs of the convergence module 325 and the feedback module 330 are made for descriptive purposes, and do not necessarily require communication or handshaking between separate hardware or software modules within the system. Instead, in some embodiments, the inputs and outputs of the convergence module 325 and the feedback module 330 are internal signals to a single module and can represent, for example, individual signals, combinations of signals, the product of multiple signals, the difference of multiple signals, the addition of multiple signals, the result of a calculation, the result of an evaluation, the result of a comparison, values retrieved from memory, values input by a user, and the like.

The circuit 300 receives an input signal, x(n) 360, which can be a real signal or a complex signal. The input signal is multiplied by a gain signal, g(n) 365, at the multiplier 305. An output signal, y(n) 370, of the multiplier 305 is input to the envelope detector 310, which obtains a signal level envelope of the signal, y(n) 370. In some embodiments, the envelope detector 310 determines the absolute value or the power of the signal, y(n) 370. An output 375 of the envelope detector 310 is subtracted from a reference signal, R 380, at the summation module 315. The reference signal, R 380, is constant or approximately constant and is related to a desired average signal level. An output of the summation module 315 is an error signal, e(n) 385, which is filtered by the filter module 320. In some embodiments, the filter module 320 includes a low-pass filter which is used to reduce instantaneous noise in the circuit 300 and obtain an average error signal 390. In one embodiment, the filter module 320 uses a first-order infinite impulse response ("IIR") filter, although other types and orders of filters can be used. Some embodiments of the invention also use addition and bit shifting to simplify the design of the filter module 320.

The output 390 of the filter module 320 enters the convergence module 325, which determines a convergence speed for the AGC circuit 300 by modifying an output 395 of the convergence control module 335 based on the average error signal 390. The output 395 of the convergence control module 335 is a scalar which is multiplied by the average error signal 390 at the second multiplier 340. A large average error signal 390 indicates that the signal, y(n) 370, is far away from the signal level of the reference signal, R 380. Thus, a large value of the signal 395 is sent to the multiplier 340, and the AGC circuit convergence speed is increased (e.g., the AGC circuit gain, g(n) 365, is increased). A small average error signal 390 indicates that the AGC circuit 300 has nearly converged. Thus, a small value of the signal 395 is sent to the multiplier 340, and the convergence speed of the AGC circuit 300 is decreased. In some embodiments, an output 400 (i.e., a gain adjusted error signal) of the convergence module 325 is proportional to the average error signal 390. The convergence control module 335 uses, for example, a LUT, and because the convergence speed of the AGC circuit 300 does not have to be precise (e.g., is coarse), a simple LUT with only a few entries is used. Additionally, because the output 395 of the convergence control module 335 also does not have to be precise (e.g., is coarse), the second multiplier does not have to be a full multiplier. In some embodiments, the second multiplier is implemented using bit shifting.

Using the convergence of the AGC circuit 300, which is determined based on the average error signal 390 in the convergence control module 335 and the feedback module 330, is advantageous for at least three reasons: (1) a large output 395 of the convergence control module 335 resulting from a large average error signal 390 during convergence guarantees a fast AGC circuit response (e.g., a fast convergence, a fast response to changing signal levels, etc.); (2) following convergence and during a tracking mode (e.g., when the average error signal is small), a small AGC circuit gain, g(n) 365, reduces the amount of noise resulting from instantaneous signal level fluctuations, and the noise is independent of the signal level of the received signal; and (3) as previously described, for a step input having a signal level, c, a time constant of the AGC circuit 300 is related (e.g., is proportional) to $1/\alpha c$, which results in the convergence speed of the AGC circuit 300 being slow when the signal level, c, is small. As is described in greater detail below, the feedback module 330 is configured to control the convergence speed of the AGC circuit 300 independently of the signal level of the received signal, x(n) 360 (e.g., when the average error signal is large, but the signal level of the received signal, x(n) 360, is small). As a result of multiplying the AGC circuit gain, g(n) 365, by the gain adjusted average error signal 400, the convergence speed of the AGC circuit 300 is substantially independent of the received signal's signal level.

The output 400 of the second multiplier 340 is multiplied by the AGC circuit gain, g(n) 365, at the third multiplier 355. The output 405 (i.e., a gain adjusted averaged error signal) of the third multiplier 355 is input to the accumulator 345, which reduces the noise in the gain adjusted averaged error signal 405. In some embodiments, the accumulator 345 has the same configuration as the accumulator 30 shown in and described with respect to FIG. 2. The output, a(n) 410, of the accumulator 345 is multiplied by a scalar quantity, a, in the scalar multiplier module 350 to generate the AGC circuit gain, g(n) 365. To ensure that the AGC circuit gain, g(n) 365, is not zero or approximately zero, embodiments of the invention include control electronics (not shown) in the accumulator 345 which compare the AGC circuit gain, g(n) 365, to one or more threshold values. In some embodiments, the control electronics are one or more comparators, logic gates, or other suitable hardware for comparing the gain, g(n) 365, to the one or more threshold values. In other embodiments, the control electronics are implemented using a combination of hardware and software (e.g., a microcontroller, microprocessor, or other suitable processing device) configured to access and execute instructions stored in a memory to compare the gain, g(n) 365, to the one or more threshold values. In most instances, the control electronics do not affect the operational range of the AGC circuit 300 because the received signal, x(n) 360, is derived from an analog-to-digital converter ("ADC") output having a limited bit-width. As a consequence, the received signal, x(n) 360, has a finite signal level which is limited to the range of the ADC, and there is a limit on how small the AGC circuit gain, g(n) 365, can be.

The feedback module 330 has a sub-loop which includes the third multiplier 355, the accumulator 345, and the scalar multiplier module 350. The sub-loop causes the statistics (e.g., variance) of the AGC circuit gain, g(n) 365, to be approximately the same for received signals having strong signal levels and received signals having weak signal levels. As such, the noise introduced by fluctuations in signal level is approximately the same regardless of the signal level of the received signal, x(n) 360.

The independent relationship between the noise due to signal level fluctuations and the received signal's signal level is shown mathematically below. Following AGC circuit stabilization, the relation shown below in EQN. 5 is true.

$$a(n)\alpha x(n) = R \Rightarrow a(n) = \frac{R}{\alpha x(n)} \qquad \text{EQN. 5}$$

where a(n) is the output 410 of the accumulator 345, x(n) is the received signal 360, α is the scalar multiplier from the scalar multiplier module 350, and R is the reference signal 380. If the received signal, x(n) 360, is changed to x(n+1) as shown below in EQN. 6, $$x(n+1) = x(n)(1+\Delta) \qquad \text{EQN. 6}$$

then, $$y(n) = x(n)a(n-1)\alpha \qquad \text{EQN. 7}$$

and $$a(n) = a(n-1) + (R - y(n))a(n-1)\alpha \qquad \text{EQN. 8}$$

The accumulator output, a(n) 410, can then be expressed as $$\text{EQN.} \quad a(n) = (R\alpha+1)a(n-1) - x(n)\alpha^2 a^2(n-1) \qquad 9$$

Using EQN. 9, the relative gain change is represented as shown in EQNS. 10 and 11.

$$\frac{a(n+1) - a(n)}{a(n)} = -\alpha^2 a(n)x(n)\Delta \qquad \text{EQN. 10}$$

$$= -\alpha^2 \frac{R}{\alpha x(n)} x(n)\Delta = -\alpha R\Delta \qquad \text{EQN. 11}$$

As such, the relative change in loop gain is independent of the received signal, x(n) 360, and the statistics of the AGC circuit gain (e.g., variance) are substantially consistent regardless of the signal level of the received signal, x(n) 360.

Additionally, the convergence module 325 and the feedback module 330 work in conjunction with one another to reduce the effects of sudden signal level changes on the AGC circuit gain, g(n) 365. For example, if a strong received signal, x(n) 360, suddenly changes to a weak signal, and the AGC circuit gain, g(n) 365, is small both before and immediately following the change, the input signal 405 to the accumulator 345 is small. The signal 405 is small due to the multiplication of a small AGC circuit gain, g(n) 365, at the third multiplier 355, and as a result, the convergence speed of the AGC circuit 300 would be slow.

In such a situation, the convergence control module 335 provides convergence speed compensation. As a consequence of the sudden signal level change of the received signal, x(n) 360, the average error signal 390 is large, and the output 395 of the convergence control module 335 is large. The large average error signal 390 and the large output 395 of the convergence control module 335 provide for faster convergence when multiplied by the gain, g(n) 365, at the multiplier 355. Soon thereafter, the AGC circuit gain, g(n) 365, is able to catch up to the change in the received signal's signal level, and the multiplication of AGC circuit gain, g(n) 365, at the third multiplier 355 quickly increases the convergence speed of the AGC circuit 300. Accordingly, only a small effect from the prior (small) AGC circuit gain, g(n) 365, is observed.

The convergence speed of the AGC circuit 300 and its statistics approximate those of the log-exponential AGC circuit 100 of FIG. 3. However, the convergence control module 335 of the AGC circuit 300 in FIG. 5 provides, among other things, freedom to control the convergence speed of the AGC circuit 300, and a less complex implementation. As an illustrative example, if the output of the convergence control module 335 is zero for a particular value (i.e., signal level) or range of values of the average error signal 390, the AGC circuit 300 is able to ignore or be insensitive to the particular value or range of values of the average error signal 390.

Figure 6:
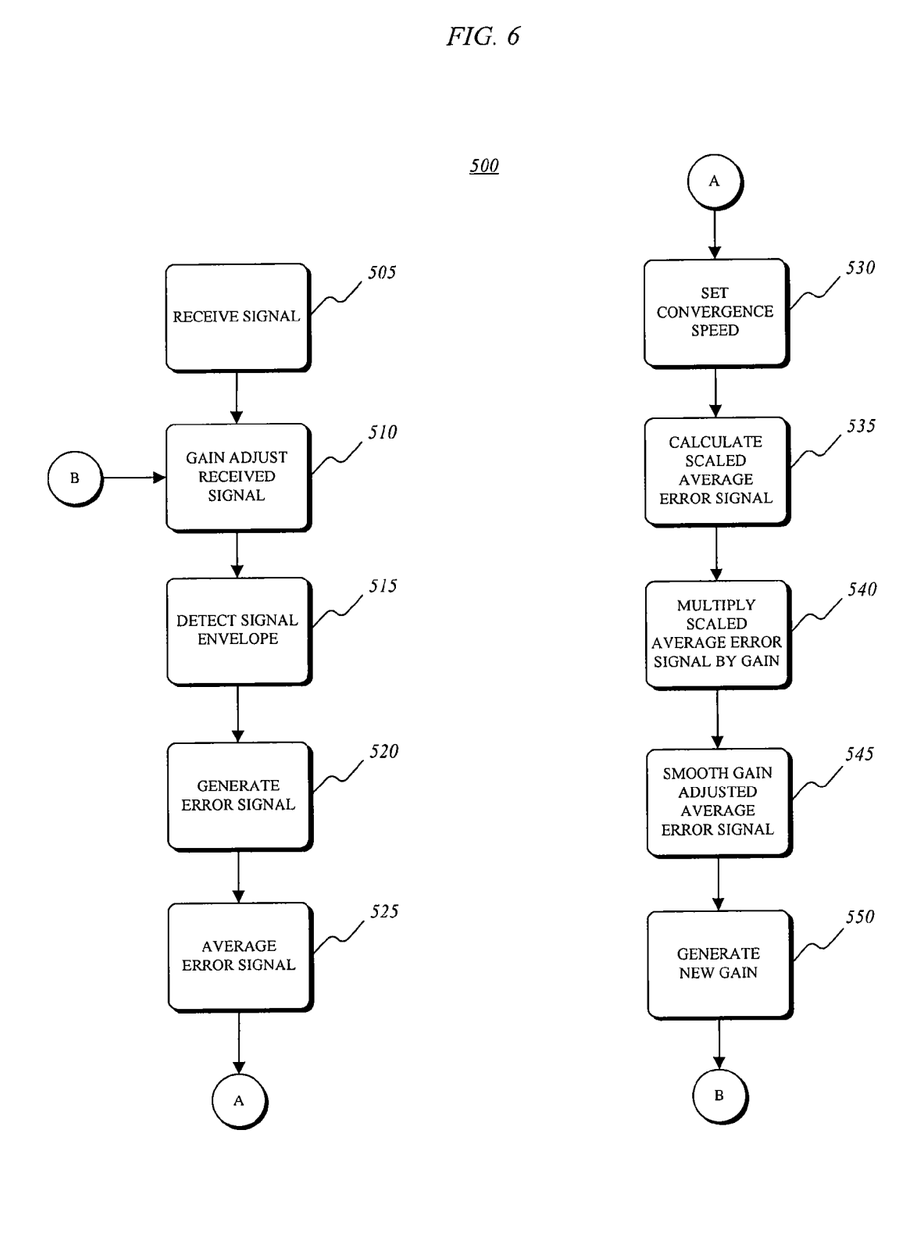
FIG. 6 is a process for AGC according to an embodiment of the invention.

A process 500 for AGC is illustrated in FIG. 6. The process 500 begins by receiving a signal (step 505). The received signal is gain adjusted by a current value of an AGC circuit gain (step 510). The gain adjusted received signal is input to the envelope detector, which detects the envelope of the gain adjusted received signal (step 515). The envelope of the gain adjusted received signal is compared to a reference signal to generate an error signal (step 520). The error signal is averaged in the filter module (step 525), and the average error signal in input to the convergence module. The convergence module sets a convergence speed of the AGC circuit based on the average error signal (step 530) (e.g., generates a scalar value based on the average error signal). The average error signal is multiplied by the scalar value to calculate a scaled average error signal (step 535). The scaled average error signal is multiplied by a current value of the AGC circuit gain (step 540) to generate a gain adjusted average error signal.

The gain adjusted average error signal is input to the accumulator which smoothes the gain adjusted average error signal (step 545). The output of the accumulator is multiplied by a scalar value, a, to generate a new AGC circuit gain (step 550). The new AGC circuit gain is multiplied by a received signal to generate a gain adjusted received signal (step 510).

Figure 7:
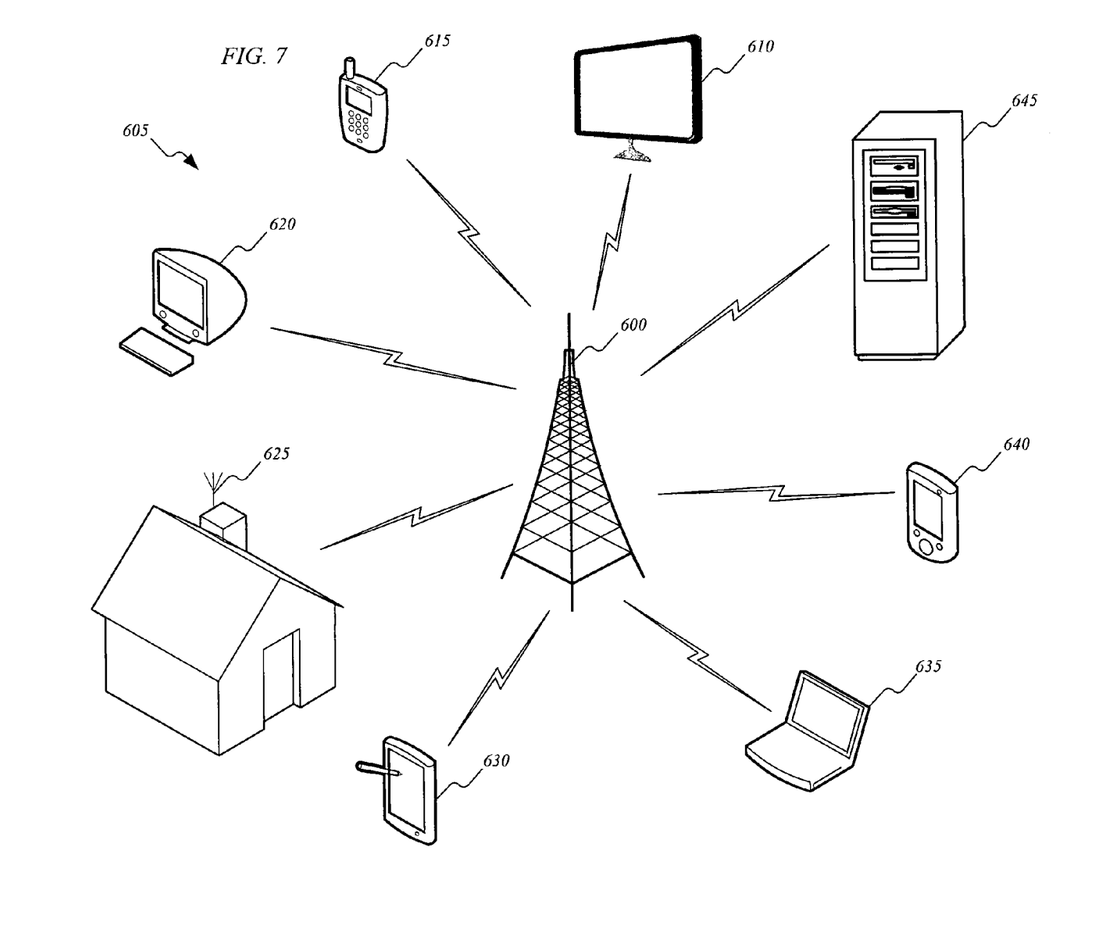
FIG. 7 illustrates a communications system that includes one or more implementations of the device of FIG. 4.

The previously described device 200, which includes the AGC circuit 300 and is capable of executing the process 500, is implemented in, or as, any of a variety of additional devices which receive radio frequency signals from a transmitter 600, such as those illustrated in the communications system 605 of FIG. 7 (e.g., a local area network, a wide area network, a broadcast system, etc.). For example, the device 200 is incorporated into a television 610, a smart phone 615, a personal computer ("PC") 620 (or a PC adapter card), one or more household antennas 625, a tablet PC 630, a laptop computer 635, a personal digital assistant ("PDA") 640, or a server 645. Additionally or alternatively, the device 200 is incorporated into a receiver (e.g., digital communication receiver), a tuner, a set top box, a DVD recorder, an HDTV recorder, or the like, which are connected to one or more of the devices 610-645 illustrated in FIG. 7.

Thus, the invention provides, among other things, an AGC system or circuit that is configured to adjust its convergence speed according to a state of system convergence. An error signal is generated as the difference between a reference signal and a scaled input signal. The error signal is processed to determine the convergence state of the AGC system, and the convergence speed of the circuit is adjusted according to the processed error signal. Various features and advantages of the invention are set forth in the following claims.

What is claimed is:

1. An automatic gain control ("AGC") system having an AGC gain and an AGC convergence speed, the AGC system comprising:
   a summation module configured to determine an error signal based at least in part on a received signal and a reference signal;
   a convergence module configured to generate a convergence speed gain for the AGC system based at least in part on the error signal, and output a scaled error signal, wherein the scaled error signal is based at least in part on the convergence speed gain and the error signal; and
   a feedback module configured to receive an input signal and output the AGC gain, the input signal based at least in part on the AGC gain and the scaled error signal, wherein at least one of the summation module, the convergence module, and the feedback module is implemented by a processing device.

2. The AGC system of claim 1, further comprising an envelope detector.

3. The AGC system of claim 2, wherein the received signal is gain adjusted by the AGC gain, and the gain adjusted received signal is input to the envelope detector.

4. The AGC system of claim 1, wherein the reference signal is a desired signal level.

5. The AGC system of claim 1, further comprising a filter module configured to average the error signal to generate an averaged error signal.

6. The AGC system of claim 5, wherein the convergence speed gain is based at least in part on the averaged error signal.

7. The AGC system of claim 5, wherein the input signal is a product of the averaged error signal, the convergence speed gain, and the AGC gain.

8. The AGC system of claim 7, further comprising an accumulator, wherein the accumulator receives the input signal.

9. The AGC system of claim 8, wherein an output of the accumulator is multiplied by a scalar quantity to generate the AGC gain, the scalar quantity having a relation to the signal level of the received signal.

10. A method of automatic gain control ("AGC") in a digital receiver, the digital receiver including an AGC module having an AGC gain and an AGC convergence speed, the method comprising:
    determining an error signal based at least in part on a received signal and a reference signal;
    generating, in a convergence module, a convergence speed gain based at least in part on the error signal, and a scaled error signal based at least in part on the convergence speed gain and the error signal; and
    generating a feedback signal based at least in part on the AGC gain and the scaled error signal, the AGC gain based at least in part on the feedback signal.

11. The method of claim 10, further comprising gain adjusting the received signal by the AGC gain, and detecting an envelope of the gain adjusted received signal.

12. The method of claim 10, further comprising averaging the error signal to generate an averaged error signal.

13. The method of claim 12, wherein the convergence speed gain is based at least in part on the averaged error signal.

14. The method of claim 12, wherein the feedback signal is a product of the averaged error signal, the convergence speed gain, and the AGC gain.

15. The method of claim 14, further comprising receiving the feedback signal at an accumulator.

16. The method of claim 15, further comprising multiplying an output of the accumulator by a scalar quantity to generate the AGC gain.

17. The method of claim 16, wherein the scalar quantity has a relation to the signal level of the received signal.

18. A device configured to process digital signals, the device comprising:
    a receiver including a demodulator, an equalizer, and an automatic-gain control ("AGC") module;
    the AGC module having an AGC gain and an AGC convergence speed, and configured to
       determine an error signal based at least in part on a received signal and a reference signal;
       generate a convergence speed gain based at least in part on the error signal and a scaled error signal based at least in part on the convergence speed gain and the error signal; and
       generate a feedback signal based at least in part on the AGC gain and the scaled error signal, the AGC gain based at least in part on the feedback signal.

19. The device of claim 18, wherein the device is a television, a PC adapter card, a set top box, a DVD recorder, a HDTV recorder, a phone, or a handheld device.

20. The device of claim 18, wherein the device is configured for use in a broadcast system, a wireless local area network ("LAN") system, or a wide area mobile system.

21. A program product for automatically controlling gain in a digital receiver, the digital receiver including an automatic gain control ("AGC") module having an AGC gain and an AGC convergence speed, the program product comprising a non-transitory processor-readable medium on which program instructions are embodied, wherein the program instructions are operable, when executed by at least one processor included in the digital receiver, to cause the digital receiver to:

determine an error signal based at least in part on a received signal and a reference signal;

generate a convergence speed gain based at least in part on the error signal, and a scaled error signal based at least in part on the convergence speed gain and the error signal; and generate a feedback signal based at least in part on the AGC gain and the scaled error signal, the AGC gain based at least in part on the feedback signal.

* * * * *